(12) United States Patent
Takayama

(10) Patent No.: US 12,396,231 B2
(45) Date of Patent: Aug. 19, 2025

(54) METHOD OF MANUFACTURING SEMICONDUCTOR DEVICE

(71) Applicant: SUMITOMO ELECTRIC INDUSTRIES, LTD., Osaka (JP)

(72) Inventor: Daiki Takayama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 407 days.

(21) Appl. No.: 18/191,278

(22) Filed: Mar. 28, 2023

(65) Prior Publication Data

US 2023/0369415 A1 Nov. 16, 2023

(30) Foreign Application Priority Data

May 12, 2022 (JP) ................... 2022-078635

(51) Int. Cl.
*H01L 29/20* (2006.01)
*H10D 30/01* (2025.01)
*H10D 30/47* (2025.01)
*H10D 62/85* (2025.01)

(52) U.S. Cl.
CPC ....... *H10D 62/8503* (2025.01); *H10D 30/015* (2025.01); *H10D 30/475* (2025.01)

(58) Field of Classification Search
None
See application file for complete search history.

(56) References Cited

U.S. PATENT DOCUMENTS

| | | |
|---|---|---|
| 9,515,161 B1 | 12/2016 | Shinohara et al. |
| 2008/0176366 A1 | 7/2008 | Mita et al. |
| 2013/0049007 A1* | 2/2013 | Sasaki ............... H10D 30/4755 257/E29.072 |

* cited by examiner

*Primary Examiner* — William C Trapanese
(74) *Attorney, Agent, or Firm* — IPUSA, PLLC

(57) ABSTRACT

A method of manufacturing a semiconductor device includes forming a protective film above an electron transport layer. The method includes forming a zinc oxide film on the protective film by a sol-gel method. The method includes forming a sacrificial film on the zinc oxide film. The method includes forming a first opening and a second opening that are each in the sacrificial film, the zinc oxide film, the protective film, an electron supply layer, and the electron transport layer. The method includes performing a first acid process to form a first space, first supports, and second supports. The method includes forming a source region and a drain region after performing the first acid process. The method includes performing a second acid process with respect to an entirety of the zinc oxide film after the formation of the source region and the drain region.

8 Claims, 6 Drawing Sheets

METHOD OF MANUFACTURING SEMICONDUCTOR DEVICE

CROSS-REFERENCE TO RELATED APPLICATIONS

This application claims priority under 35 U.S.C. § 119 to Japanese Patent Application No. 2022-078635, filed on May 12, 2022, the entire contents of which are incorporated herein by reference.

TECHNICAL FIELD

The present disclosure relates to a method of manufacturing a semiconductor device.

BACKGROUND

For high electron mobility transistors (HEMT), methods have been proposed to reduce the contact resistance, which represents the total resistance between the source and drain electrodes and the two dimensional gas (2DEG). In this method, openings are formed in an electron supply layer and an electron transport layer, a GaN ($n^+$GaN) layer containing n-type impurities at a high concentration is regrown in the openings by a metal organic chemical vapor deposition (MOCVD) method, a molecular beam epitaxy (MBE) method, or the like, and a source electrode and a drain electrode are formed on the $n^+$GaN layer (see U.S. Pat. No. 9,515,161 referred to as Patent Document 1, and U.S. Unexamined Patent Application Publication No. 2008-0176366 referred to as Patent Document 2).

SUMMARY

A method of manufacturing a semiconductor device according to the present disclosure includes forming an electron transport layer above a substrate, forming an electron supply layer above the electron transport layer, forming a protective film above the electron transport layer, forming a zinc oxide film on the protective film by a sol-gel method, forming a sacrificial film on the zinc oxide film, forming a first opening and a second opening in the sacrificial film, the zinc oxide film, the protective film, the electron supply layer, and the electron transport layer, forming, by a first acid treatment, in a first portion exposed in the first opening of the zinc oxide film, a first cavity portion (first space) and a plurality of first support pillar portions (first supports) supporting the sacrificial film in the first cavity portion, and, in a second portion exposed in the second opening of the zinc oxide film, a second cavity portion (second space) and a plurality of second support pillar portions (second supports) supporting the sacrificial film in the second cavity portion, forming, after the first acid treatment, a source region containing an impurity of a first conductivity type on a bottom surface of the first opening and a drain region containing the impurity of the first conductivity type on a bottom surface of the second opening, and subjecting, after the forming the source region and the drain region, an entirety of the zinc oxide film to a second acid treatment.

DETAILED DESCRIPTION

Figure 1:
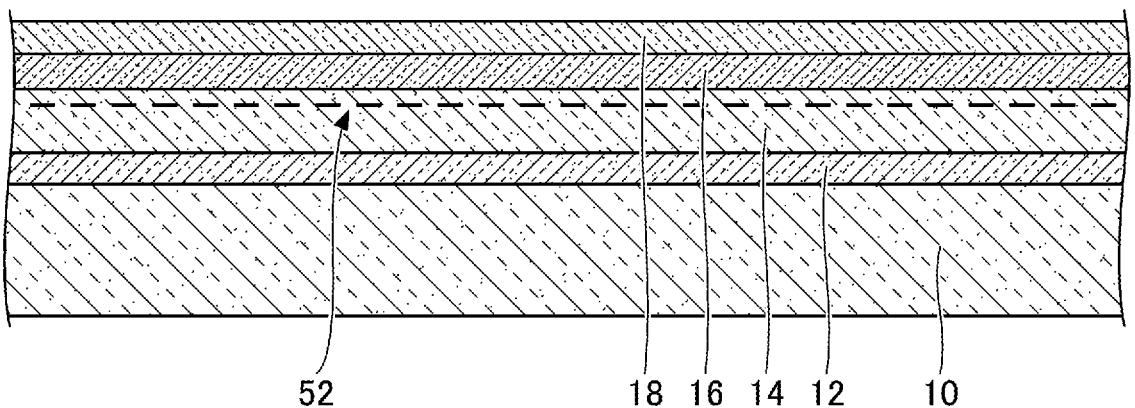
FIG. 1 is a cross-sectional view (part 1) of a semiconductor device according to an embodiment, the view being described for a method of manufacturing the semiconductor device.

When the $n^+$GaN layer is formed by the conventional method, the throughput (the number of wafers processed per unit time when film formation is continuously performed on a plurality of wafers) is significantly reduced.

An object of the present disclosure is to provide a method of manufacturing a semiconductor device capable of reducing contact resistance while suppressing a decrease in throughput.

Description of Embodiments of Present Disclosure

First, embodiments of the present disclosure will be listed and explained.

[1] A method of manufacturing a semiconductor device according to an embodiment of the present disclosure includes forming an electron transport layer above a substrate, forming an electron supply layer above the electron transport layer, forming a protective film above the electron transport layer, forming a zinc oxide film on the protective film by a sol-gel method, forming a sacrificial film on the zinc oxide film, forming a first opening and a second opening in the sacrificial film, the zinc oxide film, the protective film, the electron supply layer, and the electron transport layer, forming, by a first acid treatment, in a first portion exposed in the first opening of the zinc oxide film, a first cavity portion (space) and a plurality of first support pillar portions (supports) supporting the sacrificial film in the first cavity portion, and, in a second portion exposed in the second opening of the zinc oxide film, a second cavity portion and a plurality of second support pillar portions supporting the sacrificial film in the second cavity portion, forming, after the first acid treatment, a source region containing an impurity of a first conductivity type on a bottom surface of the first opening and a drain region containing the impurity of the first conductivity type on a bottom surface of the second opening, and subjecting, after the forming the source region and the drain region, an entirety of the zinc oxide film to a second acid treatment.

In order to suppress a decrease in throughput, the inventor of the present application has studied formation of a layer containing a high concentration of impurity (hereinafter, may be referred to as a high-concentration impurity layer) by a physical vapor deposition (PVD) method such as a sputtering method instead of the MOCVD method. As a result, it has been found that the throughput can be greatly improved. In addition, contact resistance can be reduced by forming the source region and the drain region separately from the electron transport layer and the electron supply layer.

It is also conceivable to form the source region and the drain region by forming a sacrificial film over the protective film without forming the zinc oxide film. However, in this case, when the source region and the drain region are formed, there is a concern that a layer made of a raw material of the source region and the drain region may be also formed on a side surface exposed to the first opening and a side surface exposed to the second opening of the sacrificial film. Therefore, even if removing the sacrificial film is attempted, the etchant cannot reach the sacrificial film and the sacrificial film cannot be removed. On the other hand, when the zinc oxide film is formed before the sacrificial film is formed and the first cavity portion and the second cavity portion are formed in the zinc oxide film, it is possible for the acid to infiltrate into the entire zinc oxide film during the second acid treatment. Therefore, the zinc oxide film can be appropriately removed, and the sacrificial film and the layer made of a raw material of the source region and the drain region can be removed accordingly.

In addition, when the first support pillar portion and the second support pillar portion are not formed, a portion of the sacrificial film over the first cavity portion and a portion of the sacrificial film over the second cavity portion (hereinafter, these portions may be referred to as eaves portions) may bend toward the protective film due to their own weight. In addition, after the source region and the drain region are formed, the eaves portions are easily bent toward the protective film due to the mass of the layer of the raw material of the source region and the drain region and the own weight of the sacrificial film. When the eaves portions are bent and come into contact with the protective film, the zinc oxide film cannot be appropriately removed and the sacrificial film cannot be removed. On the other hand, when the first support pillar portion and the second support pillar portion are formed, it is possible to suppress the bending of the eaves portions and to allow the acid to infiltrate into the entire zinc oxide film during the second acid treatment. Therefore, the zinc oxide film can be appropriately removed, and the sacrificial film and the layer made of a raw material of the source region and the drain region can be removed accordingly.

[2] In [1], the zinc oxide film may include a precursor of zinc oxide. In this case, it is easy to form the first cavity portion and the second cavity portion while forming the first support pillar portion and the second support pillar portion.

[3] In [1] or [2], an aluminum oxide film may be formed as the sacrificial film. In this case, it is easy to ensure a large etching selectivity between the zinc oxide film and the sacrificial film.

[4] In any one of [1] to [3], a silicon nitride film may be formed as the protective film. In this case, it is easy to ensure a large etching selectivity between the zinc oxide film and the protective film.

[5] In any one of [1] to [4], dilute phosphoric acid, dilute hydrochloric acid, or dilute hydrofluoric acid may be used for the first acid treatment and the second acid treatment. By using dilute phosphoric acid, dilute hydrochloric acid, or dilute hydrofluoric acid for the first acid treatment, it is easy to form the first cavity portion and the second cavity portion while forming the first support pillar portion and the second support pillar portion. In addition, by using dilute phosphoric acid, dilute hydrochloric acid, or dilute hydrofluoric acid for the second acid treatment, it is easy to remove the most of the zinc oxide film.

[6] In any one of [1] to [5], the method may include subjecting a portion of the zinc oxide film remaining after the second acid treatment to two-fluid cleaning (a dual-fluid cleaning process). In this case, it is easy to remove the portion of the zinc oxide film remaining after the second acid treatment.

[7] In any one of [1] to [6], a concentration of the impurity of the first conductivity type in each of the source region and the drain region may be $1\times10^{19}$ cm$^{-3}$ or more. In this case, it is easy to reduce the contact resistance.

[8] A method of manufacturing a semiconductor device according to another aspect of the present disclosure includes forming an electron transport layer above a substrate, forming an electron supply layer above the electron transport layer, forming a silicon nitride film above the electron transport layer, forming a zinc oxide film on the silicon nitride film by a sol-gel method, forming an aluminum oxide film on the zinc oxide film, forming a first opening and a second opening in the aluminum oxide film, the zinc oxide film, the silicon nitride film, the electron supply layer, and the electron transport layer, forming, by a first acid treatment, in a first portion exposed in the first opening of the zinc oxide film, a first cavity portion and a plurality of first support pillar portions supporting the aluminum oxide film in the first cavity portion, and, in a second portion exposed in the second opening of the zinc oxide film, a second cavity portion and a plurality of second support pillar portions supporting the aluminum oxide film in the second cavity portion, forming, after the first acid treatment, a source region containing an impurity of a first conductivity type on a bottom surface of the first opening and a drain region containing the impurity of the first conductivity type on a bottom surface of the second opening, subjecting, after the forming the source region and the drain region, an entirety of the zinc oxide film to a second acid treatment, and subjecting a portion of the zinc oxide film remaining after the second acid treatment to two-fluid cleaning. A concentration of the impurity of the first conductivity type in each of the source region and the drain region is $1\times10^{19}$ cm$^{-3}$ or more, and dilute phosphoric acid, dilute hydrochloric acid, or dilute hydrofluoric acid is used for the first acid treatment and the second acid treatment. In this case, it is easy to reduce the contact resistance while suppressing a decrease in throughput.

Details of Embodiments of Present Disclosure

Embodiments of the present disclosure present disclosure will be described in detail, but the present disclosure is not limited thereto. It should be noted that in the specification and the drawings of the present application, the same reference numerals may be assigned to components having substantially the same function/configuration so that repetitive descriptions may be omitted.

An embodiment of the present disclosure relates to a method of manufacturing a semiconductor device including a GaN-HEMT having a nitride semiconductor as a main constituent material. FIGS. 1 to 10 are cross-sectional views showing a method of manufacturing a semiconductor device according to an embodiment.

First, as shown in FIG. 1, a buffer layer 12, an electron transport layer 14, an electron supply layer 16 and a cap layer 18 are formed on a substrate 10. Substrate 10 is, for example, a silicon carbide (SiC) substrate whose upper surface has a plane orientation of (0001) plane. Buffer layer 12 is, for example, an AlN layer having a thickness of 5 nm to 100 nm. Electron transport layer 14 is, for example, an undoped GaN layer having a thickness of about the 1000 nm. Electron supply layer 16 is, for example, an n-type AlGaN layer having a thickness of about the 20 nm. Cap layer 18 is, for example, an n-type GaN layer having a thickness of about the 5 nm. The n-type impurity used in the embodiment of the present disclosure is, for example, silicon (Si) or germanium (Ge). The stacking direction of buffer layer 12, electron transport layer 14, electron supply layer 16, and cap layer 18 is, for example, the [0001] direction. Buffer layer 12, electron transport layer 14, electron supply layer 16, and cap layer 18 are formed by, for example, MOCVD. A 2DEG 52 is present near the top surface of electron transport layer 14.

Figure 2:
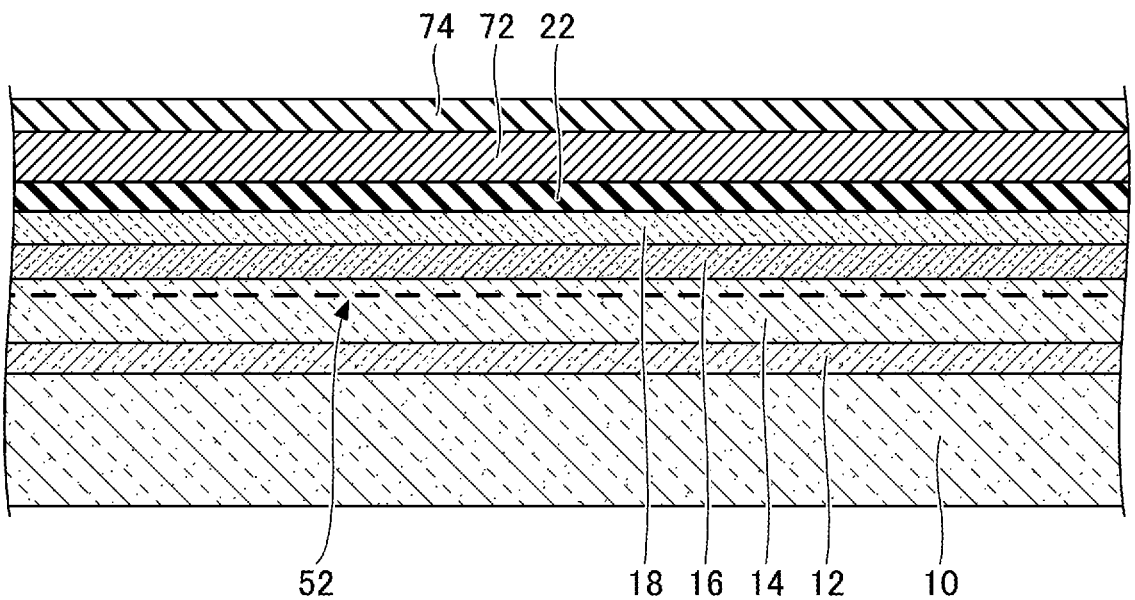
FIG. 2 is a cross-sectional view (part 2) of a semiconductor device according to an embodiment, the view being described for a method of manufacturing the semiconductor device.

Next, as shown in FIG. 2, a protective film 22 is formed on cap layer 18. Protective film 22 is, for example, a silicon nitride (SiN) film. Protective film 22 is formed by, for example, a low pressure chemical vapor deposition (LPCVD) method. Protective film 22 is, for example, 10 nm to 25 nm.

Next, a zinc oxide (ZnO) film 72 is formed on protective film 22. ZnO film 72 is formed by a sol-gel method using a precursor of ZnO. As a precursor of ZnO, for example, zinc acetate dihydrate is used. For example, a sol containing a precursor of ZnO is applied to the surface of protective film 22 and heated at a temperature of about 500° C. to be gelled. At this time, in the embodiment of the present disclosure, ZnO film 72 is formed so that the precursor of ZnO remains. That is, ZnO film 72 is heated to such an extent that ZnO film 72 is not completely crystallized. A thickness of ZnO film 72 is, for example, 100 nm to 400 nm.

Next, a sacrificial film 74 is formed on ZnO film 72. Sacrificial film 74 is, for example, an aluminum oxide ($Al_2O_3$) film. Sacrificial film 74 is formed by, for example, an atomic layer deposition (ALD) method. Sacrificial film 74 is, for example, 10 nm to 40 nm.

Figure 3:
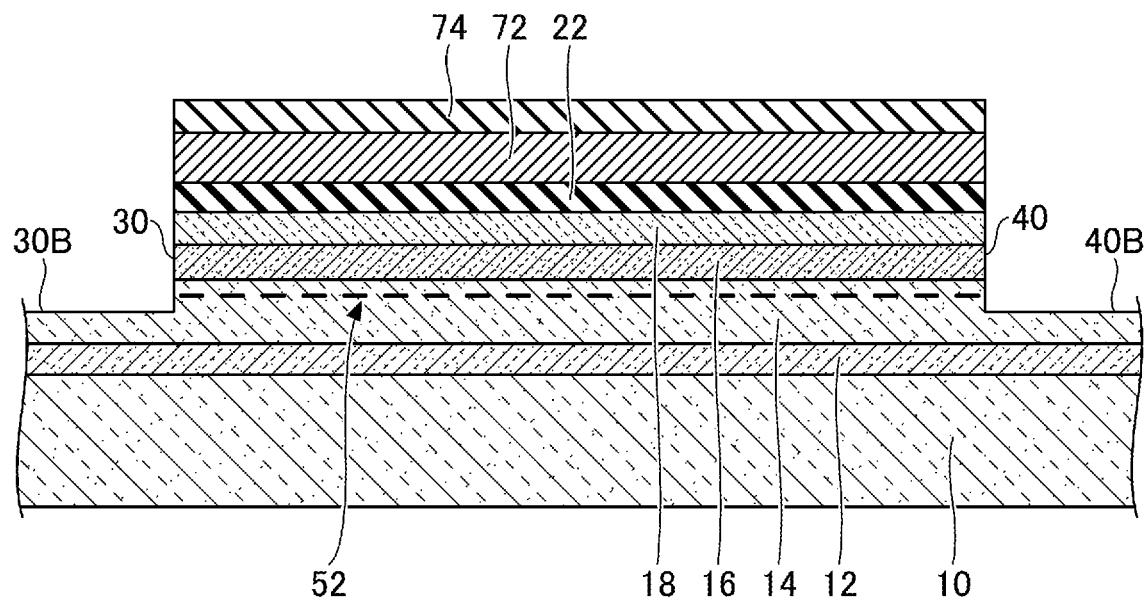
FIG. 3 is a cross-sectional view (part 3) of a semiconductor device according to an embodiment, the view being described for a method of manufacturing the semiconductor device.

Next, as shown in FIG. 3, a first opening 30 and a second opening 40 are formed in sacrificial film 74, ZnO film 72, protective film 22, cap layer 18, electron supply layer 16, and electron transport layer 14. The distance between first opening 30 and second opening 40 is, for example, about 1 μm to 200 μm. First opening 30 has a bottom surface 30B and second opening 40 has a bottom surface 40B. In the formation of first opening 30 and second opening 40, reactive ion etching (RIE) is performed using, for example, an electron beam resist (not shown) as a mask. A reactive gas containing fluorine (F) or chlorine (Cl) may be used to etch sacrificial film 74, ZnO film 72, and protective film 22. A reactive gas including chlorine (Cl) may be used to etch cap layer 18, electron supply layer 16, and electron transport layer 14.

Figure 4:
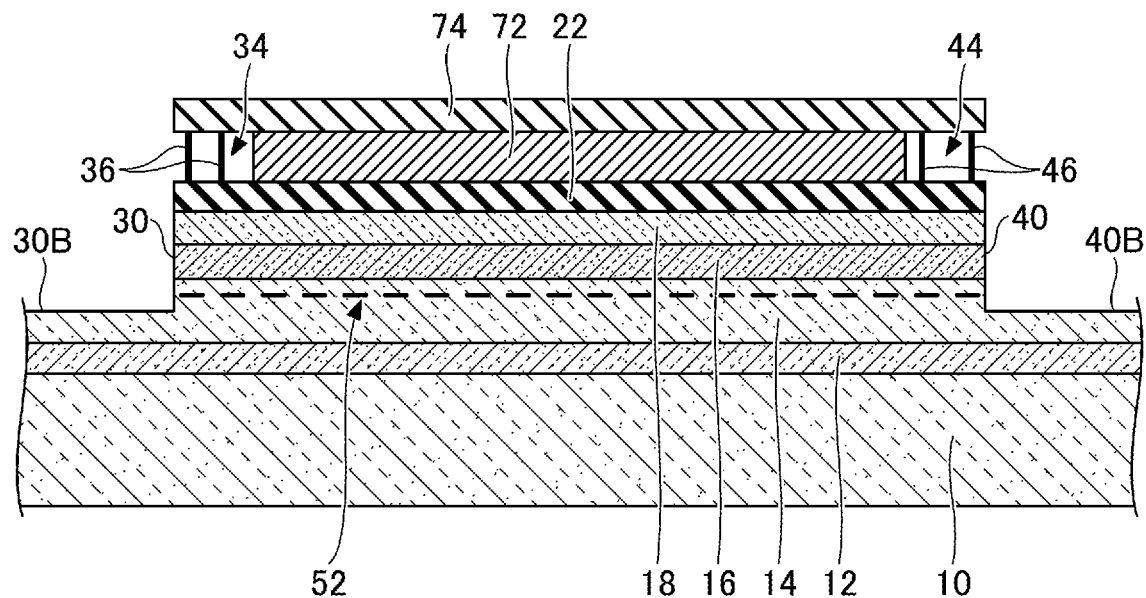
FIG. 4 is a cross-sectional view (part 4) of a semiconductor device according to an embodiment, the view being described for a method of manufacturing the semiconductor device.

Next, as shown in FIG. 4, by a first acid treatment using acid, a first cavity portion 34 and a plurality of first support pillar portions 36 are formed in the first portion exposed in first opening 30 of ZnO film 72, and a second cavity portion 44 and a plurality of second support pillar portions 46 are formed in the second portion exposed in second opening 40 of ZnO film 72, respectively. First support pillar portion 36 supports sacrificial film 74 within first cavity portion 34, and second support pillar portion 46 supports sacrificial film 74 within second cavity portion 44. The first acid treatment is performed for a period of time such that the sizes of first cavity portion 34 and second cavity portion 44 in the direction in which first opening 30 and second opening 40 are arranged are about 400 nm to 600 nm, respectively.

As the acid for the first acid treatment, for example, dilute phosphoric acid, dilute hydrochloric acid or dilute hydrofluoric acid is used. Although electron transport layer 14, electron supply layer 16, cap layer 18, protective film 22, ZnO film 72 and sacrificial film 74 are exposed to the acid, electron transport layer 14, electron supply layer 16, cap layer 18, protective film 22 and sacrificial film 74 are hardly removed. With respect to ZnO film 72, the portion where the precursor of ZnO remains is preferentially removed, but the portion where crystallization has progressed during the heat treatment for gelation is hardly removed. Thus, first cavity portion 34 and second cavity portion 44 are formed, and a plurality of first support pillar portions 36 and a plurality of second support pillar portions 46 are formed. The sizes of first support pillar portion 36 and second support pillar portion 46 are not particularly limited. For example, first support pillar portion 36 and second support pillar portion 46 have an equivalent circle diameter of about 20 nm to 100 nm.

Figure 5:
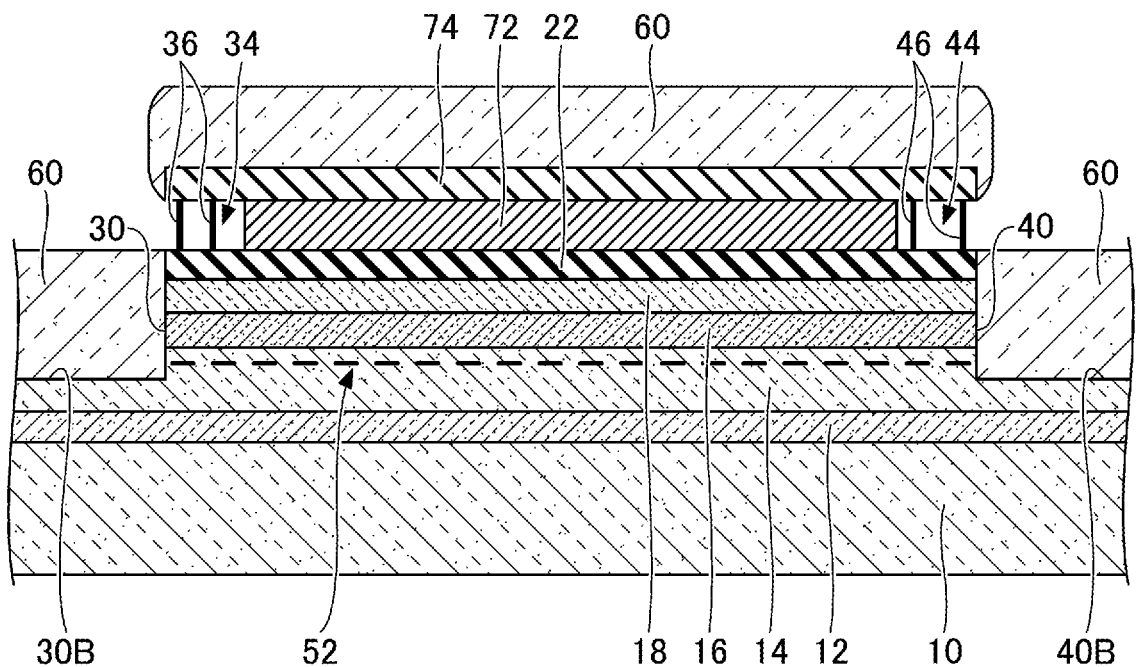
FIG. 5 is a cross-sectional view (part 5) of a semiconductor device according to an embodiment, the view being described for a method of manufacturing the semiconductor device.

Next, as shown in FIG. 5, a semiconductor layer 60 is formed in first opening 30 and second opening 40 by sputtering method. Semiconductor layer 60 is formed on bottom surface 30B of first opening 30 and on bottom surface 40B of second opening 40. When semiconductor layer 60 is formed, N radicals are used as an irradiation source. As the sputtering gas, for example, Ar, Kr or Xe is used. Semiconductor layer 60 is grown in first opening 30 and second opening 40 while being lattice-matched to electron transport layer 14. Semiconductor layer 60 is also formed on sacrificial film 74. Semiconductor layer 60 may be formed on the side surface of sacrificial film 74 exposed to first opening 30 and the side surface of sacrificial film 74 exposed to second opening 40. Semiconductor layer 60 in contact with sacrificial film 74 is, for example, polycrystalline. Semiconductor layer 60 is, for example, an n-type GaN layer. Semiconductor layer 60 contains, for example, n-type impurities at a higher concentration than electron supply layer 16. The n-type impurity concentration of semiconductor layer 60 is, for example, $1\times10^{19}$ $cm^{-3}$ or more.

When semiconductor layer 60 is formed, the temperature of substrate 10 is maintained at a temperature at which semiconductor layer 60 can be grown. Also, semiconductor layer 60 is grown while being doped with n-type impurities such as Si. During the formation of semiconductor layer 60, the temperature of substrate 10 is preferably maintained at a temperature at which the n-type impurity doped in semiconductor layer 60 is maintained in a solid solution state in semiconductor layer 60 or higher, for example, 600° C. or higher until the formation of semiconductor layer 60 is completed. By performing such temperature control, generation of a nitrogen compound of n-type impurity in semiconductor layer 60 can be suppressed.

Figure 6:
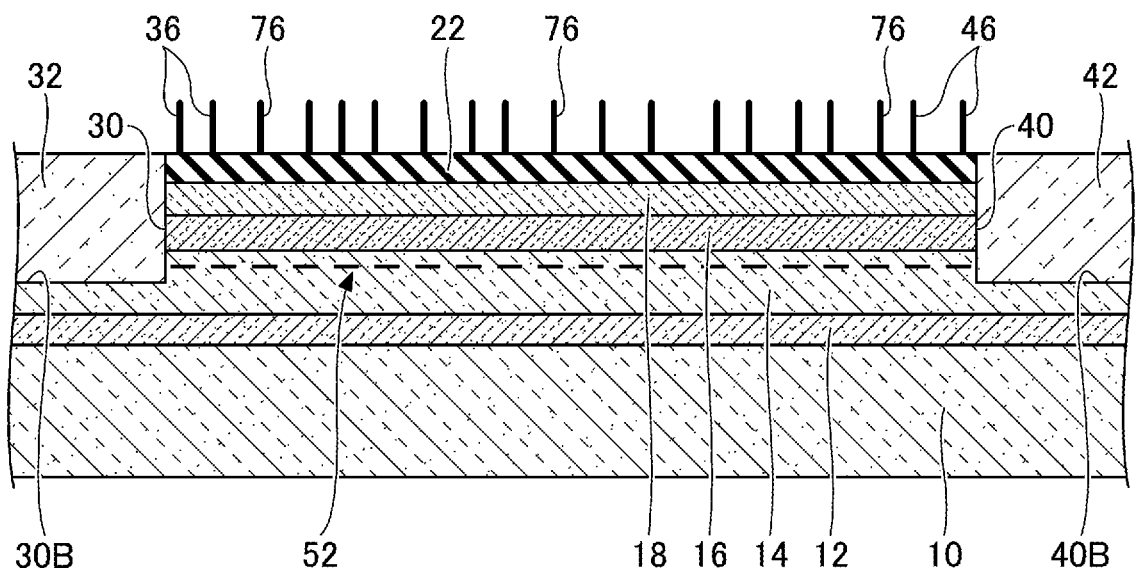
FIG. 6 is a cross-sectional view (part 6) of a semiconductor device according to an embodiment, the view being described for a method of manufacturing the semiconductor device.

Next, a second acid treatment using acid is performed on the entire surface of ZnO film 72. The second acid treatment is performed for a time sufficient for the acid to infiltrate into entire ZnO film 72. As a result, as shown in FIG. 6, most of ZnO film 72 is removed between the portion where first cavity portion 34 was present and the portion where second cavity portion 44 was present, and a portion where crystallization has progressed during the heat treatment for gelation remains as a residue 76. Also, first support pillar portion 36 and second support pillar portion 46 remain. When most of ZnO film 72 is removed, sacrificial film 74 is also removed, and a portion of semiconductor layer 60 formed on sacrificial film 74 is also removed along with the removal of sacrificial film 74. On the other hand, the portions of semiconductor layer 60 in first opening 30 and second opening 40 are not removed, so that a source region 32 is obtained in first opening 30 and a drain region 42 is obtained in second opening 40. As the acid for the second acid treatment, for example, dilute phosphoric acid, dilute hydrochloric acid or dilute hydrofluoric acid is used in the same manner as the acid for the first acid treatment.

Figure 7:
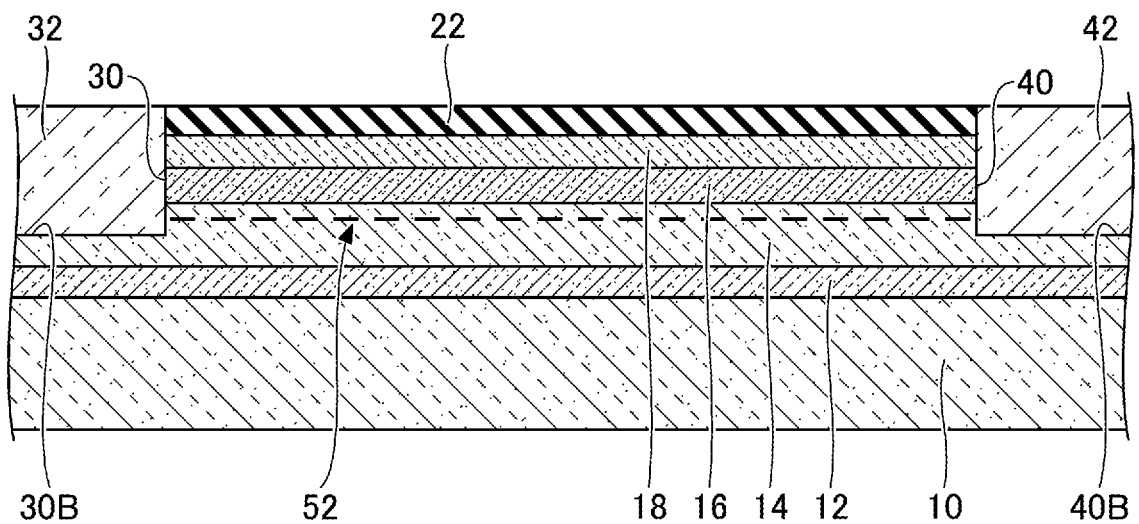
FIG. 7 is a cross-sectional view (part 7) of a semiconductor device according to an embodiment, the view being described for a method of manufacturing the semiconductor device.

Next, as shown in FIG. 7, first support pillar portion 36, second support pillar portion 46, and residue 76 are removed. First support pillar portion 36, second support pillar portion 46, and residue 76 may be removed by two fluid cleaning, such as by pure water treatment at high pressure.

Figure 8:
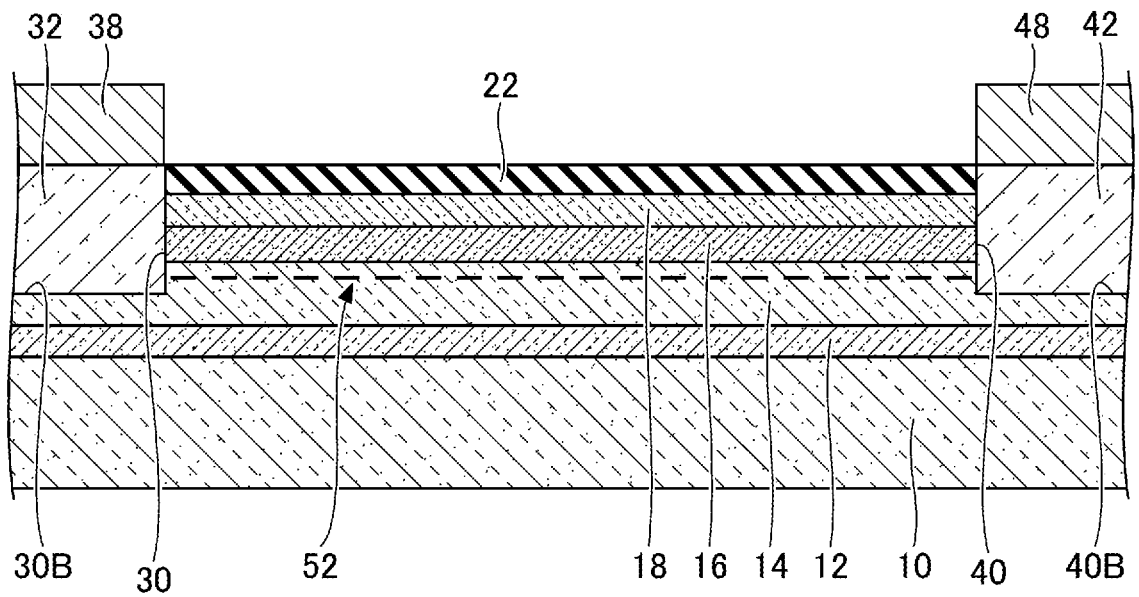
FIG. 8 is a cross-sectional view (part 8) of a semiconductor device according to an embodiment, the view being described for a method of manufacturing the semiconductor device.

Next, as shown in FIG. 8, a source electrode 38 is formed on source region 32 and a drain electrode 48 is formed on drain region 42. Source electrode 38 and drain electrode 48 may be formed by, for example, vapor deposition, lift-off, and alloying heat treatment. Source electrode 38 and drain electrode 48 include, for example, a Ta film and an Al film. Source electrode 38 and drain electrode 48 are in ohmic contact with the side 2DEG 52 via source region 32 and drain region 42, respectively.

Figure 9:
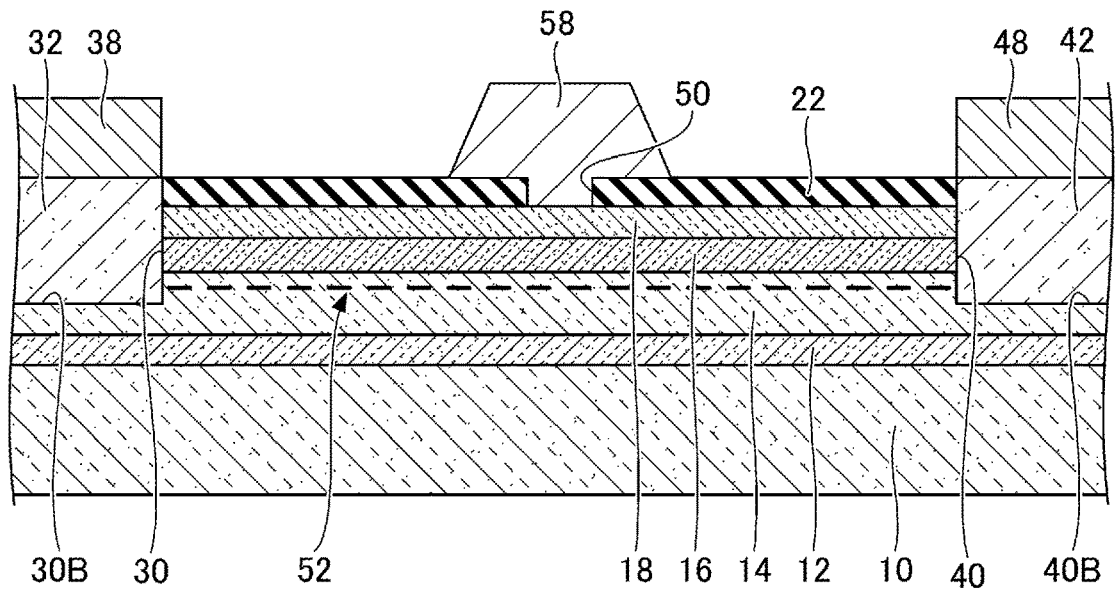
FIG. 9 is a cross-sectional view (part 9) of a semiconductor device according to an embodiment, the view being described for a method of manufacturing the semiconductor device.

Next, as shown in FIG. 9, a third opening 50 is formed in protective film 22. In the formation of third opening 50, RIE is performed using, for example, an electron beam resist (not shown) as a mask. A reactive gas containing F is used for etching protective film 22. Next, a gate electrode 58 is formed on protective film 22. Gate electrode 58 can be formed by vapor deposition and lift-off, for example. Gate electrode 58 includes, for example, a Ni film and an Au film. Gate electrode 58 is in Schottky contact with cap layer 18 through third opening 50.

Figure 10:
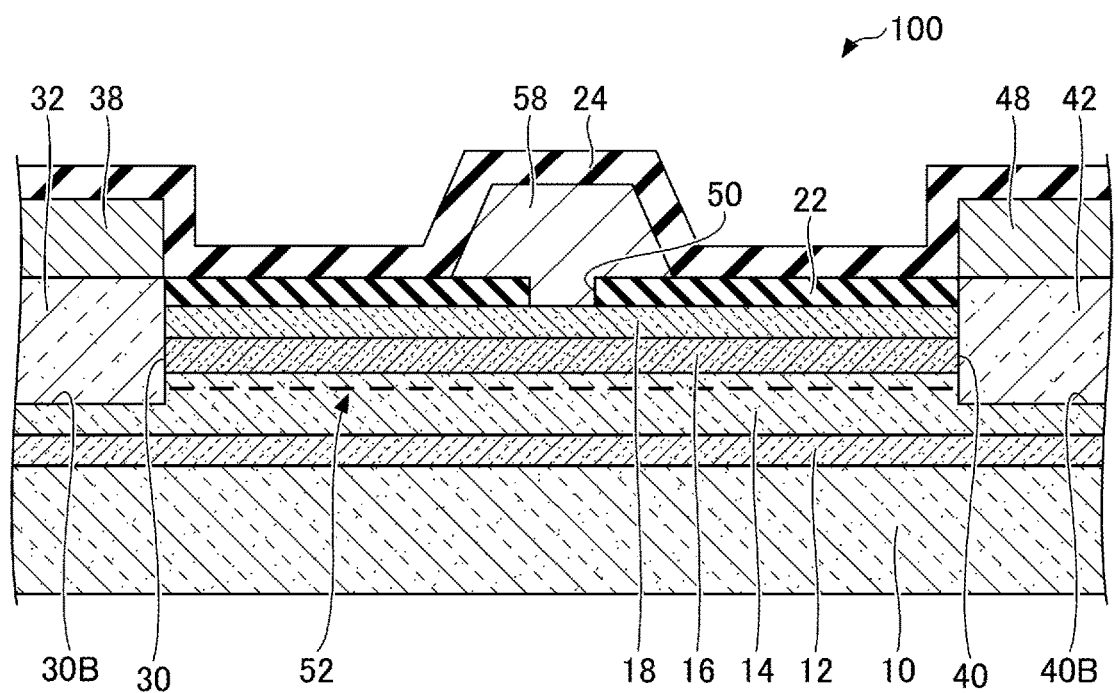
FIG. 10 is a cross-sectional view (part 10) of a semiconductor device according to an embodiment, the view being described for a method of manufacturing the semiconductor device.

Next, as shown in FIG. 10, an electrically insulating film 24 is formed to cover gate electrode 58, source electrode 38 and drain electrode 48. For example, an aluminum oxide film or a silicon nitride film is formed as electrically insulating film 24. The aluminum oxide film can be formed by, for example, an ALD method. The silicon nitride film can be formed by, for example, a plasma CVD method.

Thereafter, wiring and the like are formed as necessary. In this way, a semiconductor device 100 including the GaN-HEMT can be manufactured.

According to the embodiment of the present disclosure, since semiconductor layer 60 is formed by the sputtering method, a decrease in throughput can be suppressed as compared with the case where semiconductor layer 60 is formed by the MOCVD method. It is considered that the MOCVD method generally requires a longer film formation time than the sputtering method due to a difference in the principle of the film formation method, and thus has a lower throughput (the number of wafers processed per unit time in the case where films are continuously formed on a plurality of wafers). Further, since source region 32 and drain region 42 are formed separately from electron transport layer 14 and electron supply layer 16, the contact resistance can be reduced.

Figure 11:
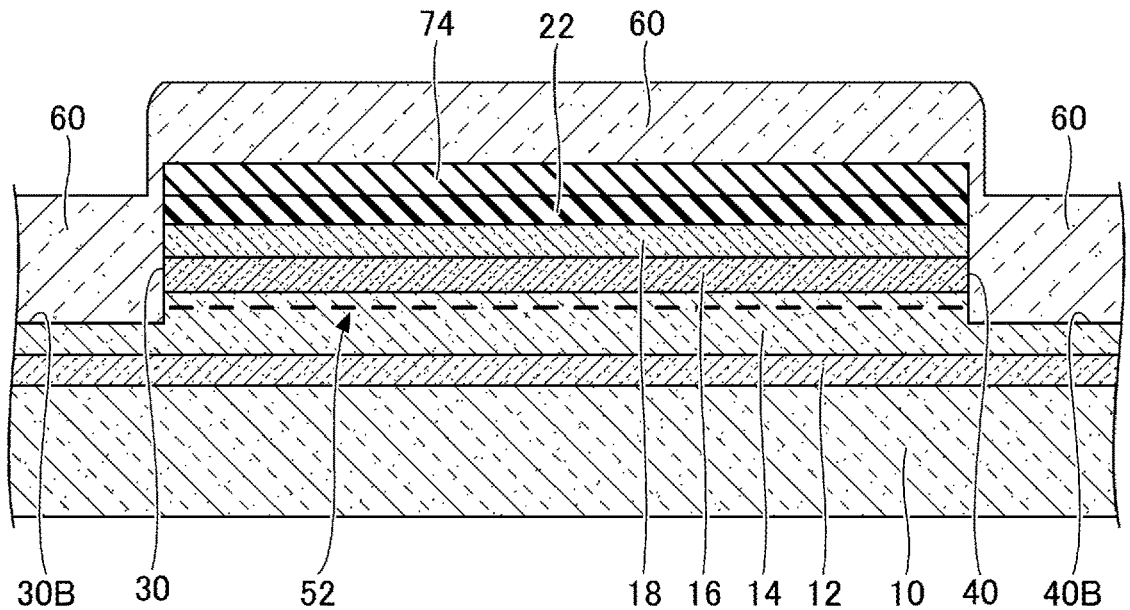
FIG. 11 is a cross-sectional view in a first reference example.

It is also conceivable to form semiconductor layer 60 by forming sacrificial film 74 on protective film 22 without forming ZnO film 72. However, in this case, when semiconductor layer 60 is formed, there is a concern that semiconductor layer 60 may be formed on the side surface of sacrificial film 74 exposed to first opening 30 and the side surface of sacrificial film 74 exposed to second opening 40. Therefore, even if an attempt is made to remove sacrificial film 74 by acid treatment or the like, the etchant cannot reach sacrificial film 74 and sacrificial film 74 cannot be removed. FIG. 11 shows a state obtained when sacrificial film 74 is formed on protective film 22 without forming ZnO film 72 as a first reference example.

On the other hand, in the embodiment of the present disclosure, since ZnO film 72 is formed before sacrificial film 74 is formed and first cavity portion 34 and second cavity portion 44 are formed in ZnO film 72, the acid can infiltrate into entire ZnO film 72 during the second acid treatment of ZnO film 72 for removing sacrificial film 74.

Figure 12:
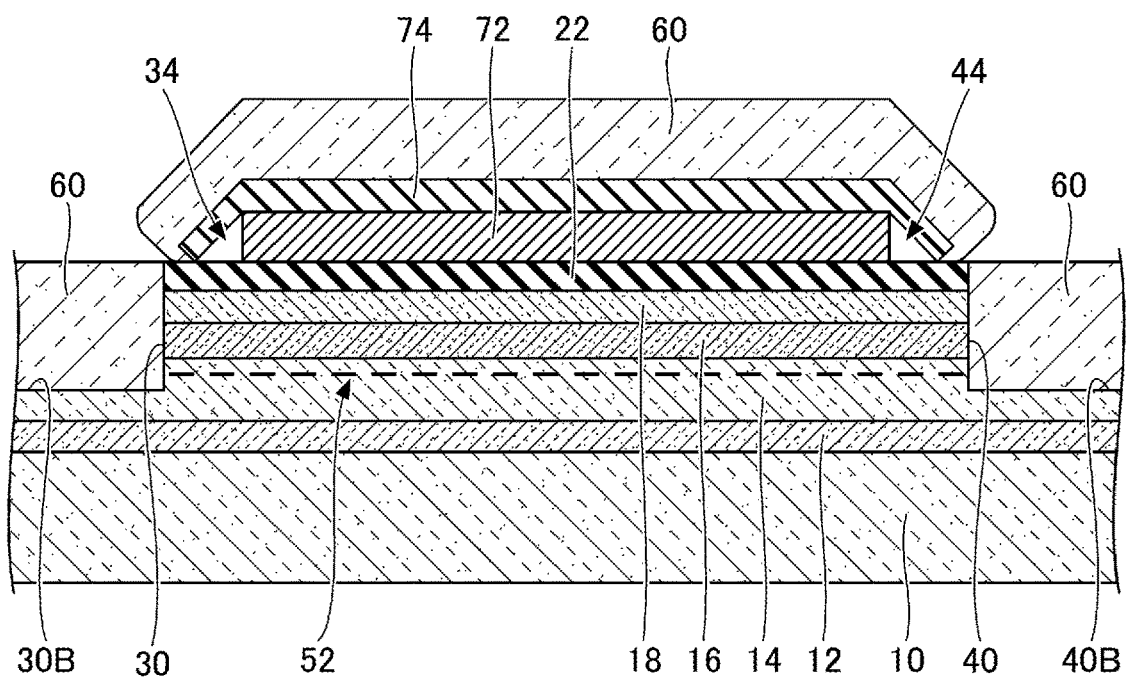
FIG. 12 is a cross-sectional view in a second reference example.

It is also conceivable to form first cavity portion 34 and second cavity portion 44 under conditions such that first support pillar portion 36 and second support pillar portion 46 are not formed. However, in this case, a portion of sacrificial film 74 over first cavity portion 34 and a portion of sacrificial film 74 over second cavity portion 44 may be bent toward protective film 22 due to their own weight. In addition, after semiconductor layer 60 is formed, the eaves portions are easily bent toward protective film 22 due to the mass of semiconductor layer 60 and the own weight of sacrificial film 74. When the eaves portions are bent and comes into contact with protective film 22, even if the second acid treatment of ZnO film 72 is attempted, the acid cannot reach ZnO film 72, ZnO film 72 cannot be removed, and sacrificial film 74 cannot also be removed. FIG. 12 shows a state obtained when first cavity portion 34 and second cavity portion 44 are formed without forming first support pillar portion 36 and second support pillar portion 46 as a second reference example.

On the other hand, in the embodiment of the present disclosure, since first support pillar portion 36 and second support pillar portion 46 are formed, it is possible to suppress the bending of the eaves portions and to allow the acid to infiltrate into entire ZnO film 72 during the second acid treatment of ZnO film 72 for removing sacrificial film 74.

When ZnO film 72 is formed by the sol-gel method, the precursor of ZnO can be left in ZnO film 72, so that first cavity portion 34 and second cavity portion 44 can be formed while first support pillar portion 36 and second support pillar portion 46 are formed. On the other hand, when ZnO film 72 is formed by sputtering method, since ZnO film 72 does not contain a precursor of ZnO, it is difficult to form first cavity portion 34 and second cavity portion 44 while forming first support pillar portion 36 and second support pillar portion 46.

Since ZnO film 72 includes the precursor of ZnO, it is easy to form first cavity portion 34 and second cavity portion 44 while forming first support pillar portion 36 and second support pillar portion 46.

By forming the aluminum oxide film as sacrificial film 74, it is easy to ensure a large etching selectivity between ZnO film 72 and sacrificial film 74. In addition, by forming a silicon nitride film as protective film 22, it is easy to ensure a large etching selectivity between ZnO film 72 and protective film 22.

By using dilute phosphoric acid, dilute hydrochloric acid, or dilute hydrofluoric acid for the first acid treatment, it is easy to form first cavity portion 34 and second cavity portion 44 while forming first support pillar portion 36 and second support pillar portion 46. Most of ZnO film 72 can be easily removed by using dilute phosphoric acid, dilute hydrochloric acid, or dilute hydrofluoric acid for the second acid treatment.

By performing the two fluid cleaning on residue 76 of ZnO film 72, it is easy to remove first support pillar portion 36, second support pillar portion 46, and residue 76.

The impurity concentration of the n-type conductivity of each of source region 32 and drain region 42 is preferably $1 \times 10^{19}$ cm$^{-3}$ or more, more preferably $2 \times 10^{19}$ cm$^{-3}$ or more, and still more preferably $3 \times 10^{19}$ cm$^{-3}$ or more. This is to easily reduce the contact resistance of source electrode 38 and drain electrode 48.

As described above, Ar, Kr, or Xe is used to form semiconductor layer 60. Therefore, Ar, Kr, or Xe may remain in source region 32 and drain region 42. Since the nitride semiconductor layer formed by the MOCVD method does not contain Ar, Kr, or Xe, it is possible to determine whether source region 32 and drain region 42 are formed by the sputtering method or the MOCVD method based on whether Ar, Kr, or Xe remains.

The impurity concentration in source region 32 and drain region 42 can be measured by, for example, a Secondary Ion Mass Spectrometry (SIMS) method.

The material of source region 32 and drain region 42 is not limited to GaN. The material of semiconductor layer 60 may be AlGaN, AlN, InAlN, InAlGaN, or the like.

Although the embodiments have been described in detail above, the present invention is not limited to specific embodiments, and various modifications and changes can be made within the scope described in the claims.

What is claimed is:

1. A method of manufacturing a semiconductor device, the method comprising:
    forming an electron transport layer above a substrate;
    forming an electron supply layer above the electron transport layer;
    forming a protective film above the electron transport layer;
    forming a zinc oxide film on the protective film by a sol-gel method;
    forming a sacrificial film on the zinc oxide film;
    forming a first opening and a second opening, each of the first opening and the second opening being formed in the sacrificial film, the zinc oxide film, the protective film, the electron supply layer, and the electron transport layer;
    performing a first acid process to form
        a first space,
        a plurality of first supports that support the sacrificial film in the first space, the first space and the plurality of first supports being formed in a first portion of the zinc oxide film exposed through the first opening, and
        a second space, and
        a plurality of second supports that support the sacrificial film in the second space, the second space and the plurality of supports being formed in a second portion of the zinc oxide film exposed in the second opening;
    forming a source region and a drain region after performing the first acid process, the source region including a first conductive type impurity, and being situated on a bottom surface of the first opening, the drain region including the first conductive type impurity, and being situated on a bottom surface of the second opening; and
    performing a second acid process with respect to an entirety of the zinc oxide film, after the formation of the source region and the drain region.

2. The method of manufacturing a semiconductor device according to claim 1, wherein the zinc oxide film includes a zinc oxide precursor.

3. The method of manufacturing a semiconductor device according to claim 1, wherein the sacrificial film formed is an aluminum oxide film.

4. The method of manufacturing a semiconductor device according to claim 1, wherein the formed protective film is a silicon nitride film.

5. The method of manufacturing a semiconductor device according to claim 1, wherein each of the first acid process and the second acid process is performed using dilute phosphoric acid, dilute hydrochloric acid, or dilute hydrofluoric acid.

6. The method of manufacturing a semiconductor device according to claim 1, further comprising performing a dual-fluid cleaning process to remove a remaining portion of the zinc oxide film after the second acid process.

7. The method of manufacturing a semiconductor device according to claim 1, wherein a concentration of the first conductive type impurity in each of the source region and the drain region is $1 \times 10^{19}$ cm$^{-3}$ or more.

8. A method of manufacturing a semiconductor device, the method comprising:
    forming an electron transport layer above a substrate;
    forming an electron supply layer above the electron transport layer;
    forming a silicon nitride film above the electron transport layer;
    forming a zinc oxide film on the silicon nitride film by a sol-gel method;
    forming an aluminum oxide film on the zinc oxide film;
    forming a first opening and a second opening, each of the first opening and the second opening being formed in the aluminum oxide film, the zinc oxide film, the silicon nitride film, the electron supply layer, and the electron transport layer;
    performing a first acid process to form
        a first space,
        a plurality of first supports that support the aluminum oxide film in the first space, the first space and the plurality of first supports being formed in a first portion of the zinc oxide film exposed through the first opening, and
        a second space, and
        a plurality of second supports that support the aluminum oxide film in the second space, the second space and the plurality of second supports being formed in a second portion of the zinc oxide film exposed in the second opening;
    forming a source region and a drain region after performing the first acid process, the source region including a first conductive type impurity, and being situated on a bottom surface of the first opening, the drain region including the first conductive type impurity, and being situated on a bottom surface of the second opening;

performing a second acid process with respect to an entirety of the zinc oxide film, after the formation of the source region and the drain region; and performing a dual-fluid cleaning process to remove a remaining portion of the zinc oxide film after the second acid process, wherein a concentration of the first conductive type impurity in each of the source region and the drain region is $1\times10^{19}$ cm$^{-3}$ or more, and wherein the first acid process and the second acid process is performing using dilute phosphoric acid, dilute hydrochloric acid, or dilute hydrofluoric acid.

\* \* \* \* \*